(12) United States Patent
Peuser et al.

(10) Patent No.: US 8,928,802 B2
(45) Date of Patent: Jan. 6, 2015

(54) METHOD AND APPARATUS FOR PRODUCING HIGH DYNAMIC RANGE (HDR) PICTURES, AND EXPOSURE APPARATUSES FOR USE THEREIN

(75) Inventors: Peter Peuser, Riemerling (DE); Klaus Schertler, Garching (DE)

(73) Assignee: EADS Deutschland GmbH, Ottobrunn (DE)

( * ) Notice: Subject to any disclaimer, the term of this patent is extended or adjusted under 35 U.S.C. 154(b) by 752 days.

(21) Appl. No.: 13/001,385

(22) PCT Filed: Jun. 25, 2009

(86) PCT No.: PCT/DE2009/000877
§ 371 (c)(1),
(2), (4) Date: Mar. 4, 2011

(87) PCT Pub. No.: WO2010/000230
PCT Pub. Date: Jan. 7, 2010

(65) Prior Publication Data
US 2011/0141317 A1    Jun. 16, 2011

(30) Foreign Application Priority Data
Jul. 2, 2008    (DE) .......................... 10 2008 031 243

(51) Int. Cl.
*H04N 5/222*    (2006.01)
*H04N 9/09*    (2006.01)
*G03B 15/03*    (2006.01)
*H01S 5/40*    (2006.01)
*H04N 5/235*    (2006.01)
*H01S 5/00*    (2006.01)
*H01S 5/022*    (2006.01)

(52) U.S. Cl.
CPC .............. *G03B 15/03* (2013.01); *H01S 5/4043* (2013.01); *H04N 5/2354* (2013.01); *H04N 5/2355* (2013.01); *G06T 2207/20208* (2013.01); *H01S 5/005* (2013.01); *H01S 5/02248* (2013.01); *H01S 5/4087* (2013.01)
USPC ........................................... 348/370; 348/265

(58) Field of Classification Search
CPC .. H04N 5/2355; H04N 5/355; H04N 5/35545
USPC ......... 348/235, 262, 263, 264, 265, 266, 267, 348/268, 269, 270, 272, 273, 289, 290, 291, 348/370, 371, 222.1, 260, 261, 362
See application file for complete search history.

(56) References Cited

U.S. PATENT DOCUMENTS 4,584,606 A * 4/1986 Nagasaki ...................... 348/269
4,866,285 A    9/1989 Simms
(Continued)

FOREIGN PATENT DOCUMENTS

DE    10010619 A1    9/2001
DE    10214960 A1    10/2003
(Continued)

OTHER PUBLICATIONS

J. Findeisen, H.J. Eichler, P.Peuser, A.A.Kaminskii, J. Hulliger; Diode-pumped $Ba(NO_3)_2$ and $NaBrO_3$ Raman lasers, B 70 (2000) 159.
(Continued)

*Primary Examiner* — Aung S Moe
*Assistant Examiner* — Chriss Yoder, III
(74) *Attorney, Agent, or Firm* — Global IP Counselors, LLP (57) ABSTRACT

The invention relates to an apparatus and a method for producing dynamic range increase (DRI) or a high dynamic range (HDR) pictures, in which differently exposed individual images are combined by image processing to form an HDR or DRI picture. In order to also allow moving objects to be recorded more easily, and to overcome the restrictions relating to lack of mobility of a recording device, the exposure can be carried out by laser radiation containing wavelengths at different intensities.

13 Claims, 4 Drawing Sheets

(56) References Cited

U.S. PATENT DOCUMENTS

| | | | |
|---|---|---|---|
| 5,920,361 A | 7/1999 | Gibeau et al. | |
| 6,095,661 A * | 8/2000 | Lebens et al. | 362/184 |
| 6,239,828 B1 | 5/2001 | Ito et al. | |
| 6,611,289 B1 * | 8/2003 | Yu et al. | 348/265 |
| 8,320,047 B2 * | 11/2012 | Tocci | 359/629 |
| 2003/0117412 A1 * | 6/2003 | Brooksby et al. | 345/589 |
| 2004/0207734 A1 | 10/2004 | Horiuchi | |
| 2005/0213958 A1 * | 9/2005 | Uemura | 396/182 |
| 2006/0061680 A1 * | 3/2006 | Madhavan et al. | 348/370 |
| 2006/0221209 A1 | 10/2006 | McGuire et al. | |
| 2007/0025717 A1 | 2/2007 | Raskar et al. | |
| 2007/0195294 A1 | 8/2007 | Willey et al. | |
| 2007/0253033 A1 | 11/2007 | Johansen et al. | |
| 2008/0101429 A1 * | 5/2008 | Sipes | 372/50.12 |

FOREIGN PATENT DOCUMENTS

| | | | |
|---|---|---|---|
| EP | 1308767 | A2 | 5/2003 |
| WO | WO-2006/007756 | A2 | 1/2006 |

OTHER PUBLICATIONS

J. Findeisen, Dissertation, TU Berlin, 1999, D83, Chapter 3, pp. 39-40.

P. Peuser, W. Plants, P. Zeller, High-power, longitudinally fiber-pumped, passively Q-switched Nd: YAG oscillator-amplifier, Opt. Lett. 31 (2006) 1991.

P. Peuser, N.P.Schmitt, Diodengepumpte Festkorperlaser; Springer-Verlag, Heidelberg, 1995.

Invention to pay additional fees and, where applicable, protest fee (PCT/ISA/206) of corresponding International Application No. PCT/DE2009/000877, dated Nov. 3, 2009.

German Office Action of corresponding German Application No. 10 2008 031 243.6, dated May 22, 2009.

International Search Report of corresponding International Application No. PCT/DE2009/000877, dated Jan. 14, 2010.

Written Opinion of the International Search Authority of corresponding International Application No. PCT/DE2009/000877, dated Jan. 28, 2010.

\* cited by examiner

METHOD AND APPARATUS FOR PRODUCING HIGH DYNAMIC RANGE (HDR) PICTURES, AND EXPOSURE APPARATUSES FOR USE THEREIN

CROSS-REFERENCE TO RELATED APPLICATIONS

This U.S. National stage application claims priority under 35 U.S.C. §119(a) to German Patent Application No. 10 2008 031 243.6, filed in Germany on Jul. 2, 2008, the entire contents of which are hereby incorporated herein by reference.

BACKGROUND

1. Field of the Invention

The invention relates to a method and an apparatus for producing high dynamic range (HDR) pictures. The invention also relates to advantageous exposure apparatuses for use in a method such as this and an apparatus such as this.

2. Background Information

In photography and image processing, HDR image production or else dynamic range increase—or DRI technology—is known as a method by means of which a new image with a very high contrast ratio can be produced algorithmically from a series of differently exposed individual images (exposure series).

HDR image production, alternatively also referred to as dynamic range increase technology, is used in digital photography, in order to widen the dynamic range of an image.

The aim of the HDR image production method or the DRI method is to map the overall contrast of a motif with major brightness differences on an image and thus to obtain as many details as possible, or all details, using a plurality of images with a narrower contrast range than that of the original motif as a source.

In this case, a plurality of recordings of exactly the same image detail are made using different exposure times. This results in overexposed points in the recordings which have been exposed for longer times, but which allow even weakly illuminated areas to be seen. In contrast, the bright points can be seen such that they can be differentiated in the recordings with the shorter exposure times while, however, the poorly illuminated areas are black.

These individual recordings are subsequently combined using an image processing program, with the brightest points in a recording in each case being replaced by those from the next darker recording. This results in an image which can reflect a wider contrast range, and in which both the brightest and the darkest points can be seen in their structure.

In general, scenes with objects which have moved or are moving present difficulties, for example running people or animals, fluttering flags, etc.

By way of example, recordings with exposures of $1/125$ seconds, $1/60$ seconds, $1/30$ seconds, $1/15$ seconds etc. are taken in order to produce an exposure series of successive recordings. The large amount of time which is required to produce the exposure series in this way results in the following restrictions to the method:

The imaged scene must be static.
The scene must not, for example, have any moving objects or objects whose shape is changing (people running, plants in the wind, waves etc., are generally difficult).
The camera must be installed statically, for example mounted on a stand.

SUMMARY

An object of the invention is to allow HDR or DRI recordings in which even moving objects can be recorded more easily and/or in which the camera can also be arranged such that it can move.

This object is achieved by a method as recited in the claims.

Advantageous exposure devices for use in a method such as this, as well as in an apparatus such as this, are the subject matter of the claims.

Advantageous refinements of the invention are also the subject matter of the claims.

The invention makes it possible to produce highly dynamic images (HDR or DRI images) using an imaging system with active laser-based illumination.

In particular, image series can be produced by means of a laser illumination pulse, which contains a plurality of wavelengths at different intensities, or by a (preferably extremely rapid) sequence of (preferably very short) laser light pulses with different intensities, with a very short amount of time being required in comparison to exposure series using the previously known method, as a result of which there is no longer any restriction with respect to the dynamics of the scene or the movement of the camera itself.

By way of example, this makes it possible to carry out a DRI or HDR recording of rapidly moving objects, a long distance away, from flying platforms.

The object to be recorded is illuminated with a different intensity by means of laser radiation from a laser apparatus, and an individual image is in each case recorded for each intensity.

Different intensities result in independence from exposure times, so that this itself makes it possible to achieve a considerable time advantage for image recording.

The individual images can be recorded successively in time, preferably using a camera with extremely rapid individual image recording, in time with the laser pulses.

The image processing software assembles the overall image from the individual images as in the traditional method, for which information is required about the intensity which has been used to record the respective individual image.

According to one embodiment of the invention, this can be achieved by a measurement apparatus which is supplied with a portion of the radiation for measurement of the intensity at the same time.

Faster and more reliable information can be obtained about the intensities, for image processing purposes, if the respective transmitted intensities have already been appropriately coded or marked during transmission.

In one advantageous refinement of the invention, this can be achieved by a predetermined time sequence with which laser pulses of specific intensities are emitted. The receiving part is then supplied with the information relating to the time sequence, as a result of which it can associate the individual successively recorded individual images with the respective intensity.

A faster method can be achieved by associating the respective intensities with different wavelengths of the laser radiation to be transmitted. The receiving part can then appropriately filter out the wavelengths and pass them into different recording devices, in particular cameras. This allows very short recording of the individual images successively, and this is no longer governed so severely by the recording rate of the individual camera.

However, it is also possible to emit the wavelengths with different intensities at the same time, for example in one combined laser pulse. Because of the different wavelength, the different intensities can then be associated with different cameras, which then record the corresponding individual images.

The radiation element at a different wavelength can be achieved in the transmitting part, for example likewise by splitting the radiation from a laser into different radiation elements, with corresponding wave conversion.

Other embodiments for suitable laser apparatuses for providing the laser radiation which is used as light radiation for illumination of the object to be recorded have a plurality of lasers, arranged in a common laser apparatus, which emit the different laser radiation elements.

This can be achieved particularly advantageously by diode lasers, which can also be stacked very closely together.

In the method mentioned above, in which the laser pulses of different intensity are emitted successively, it is possible to operate a diode laser with a corresponding current pulse sequence. In this context, it is also advantageous to provide a diode laser arrangement with a correspondingly high beam power.

In the embodiment with different wavelengths, an arrangement can be formed from diode lasers with different emission wavelengths. Different intensities can be achieved by different dimensions of the diode laser units—for example by providing different numbers of diode laser bars which, for example, are each arranged in a stacked manner.

A pulse laser sequence with varying intensity can alternatively also be achieved, for example, by a laser oscillator/amplifier. In this case, the laser oscillator can transmit laser pulses at the same wavelength and with the same intensity. The downstream laser amplifier is operated with pump energy which varies over time, in order to differently amplify the individual pulses in this pulse sequence.

BRIEF DESCRIPTION OF THE DRAWINGS

Exemplary embodiments of the invention will be explained in more detail in the following text with reference to the attached drawing, in which.

DETAILED DESCRIPTION OF EMBODIMENTS

In a first embodiment of a method for DRI or HDR image production, the typical exposure series of the traditional HDR (high dynamic range) image production or DRI (dynamic range increase) image production is replaced by a sequence of K short laser light pulses which follow one another at very short time intervals. By way of example, the laser light pulses follow one another in the nanosecond or picosecond range.

In the first embodiment of the method, the individual pulses (N=1 ... K) in this case are at different wavelengths $\lambda_N$ (color coding) and have different intensities $I_N$ (illumination intensity).

By way of example, the intensity rises from one pulse to another within the pulse series ($I_N \geq I_{N+1}$). A pulse series such as this with an intensity which increases from one pulse to another corresponds to the increased exposure times in the traditional method, thus making it possible to use the same type of image processing software as a traditional method.

The recording of K images, spectrally filtered corresponding to the wavelength $\lambda_N$, of the back-scattered light now allows the individual images produced in this way to be associated with the transmitted intensities $I_N$. The algorithmic methods—which are in principle known and are commercially available in the form of software—for HDR image production or DRI image production can now be applied to the series of K individual images with a known illumination intensity.

By way of example, this allows HDR recording of rapidly moving objects from flying platforms.

In one alternative method, as an alternative to the use of a pulse sequence, the illumination is carried out using a single, specially configured, laser pulse which contains different wavelengths with different intensities.

Figure 1:
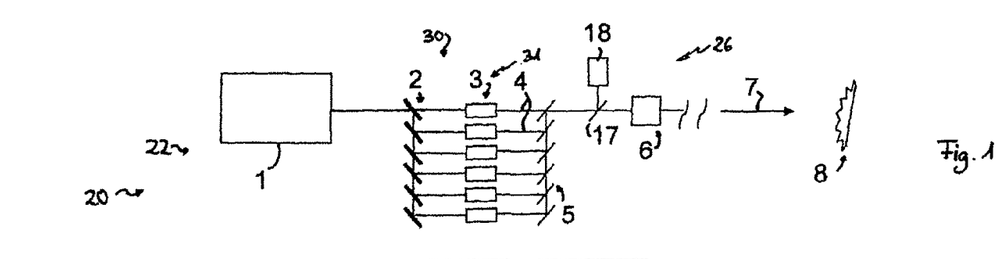
FIG. 1 shows a transmitting part of a first embodiment of an apparatus for producing HDR or DRI pictures, in a schematic form.
Figure 2:
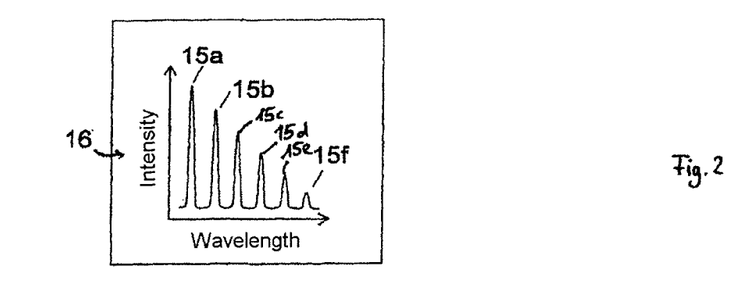
FIG. 2 shows a graph with an example of an intensity distribution of the laser radiation emitted by the transmitting part shown in FIG. 1.
Figure 3:
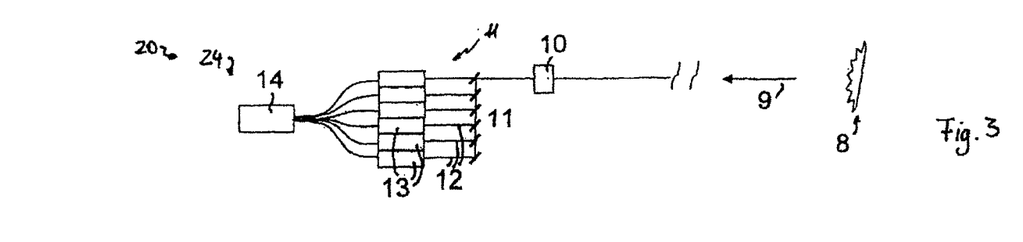
FIG. 3 shows a receiving part of the first embodiment of the apparatus for producing DRI or HDR pictures, in the form of a schematic simplified illustration.

FIGS. 1 and 3 show one embodiment of an apparatus 20 for HDR or DRI image production. The apparatus 20 has a transmitting part 22, which is illustrated in FIG. 1, and a receiving part 24, which is illustrated in FIG. 3. The transmitting part has a laser apparatus 26. The laser apparatus 26 in the example illustrated here produces a laser beam, which is shown as a spectrum in FIG. 2.

The receiving part 24 has a recording device 28 and an image processing unit 14.

In a first version of the apparatus 20, the laser apparatus 26 has a short-pulse laser 1 which transmits radiation with pulse widths in the nanosecond or picosecond range. The laser apparatus 26 furthermore has a special beamforming arrangement 30, in which pulse sequences are produced in which each individual pulse 15a to 15f is at a different wavelength and has a different intensity. In this case, the pulse intervals are preferably in the nanosecond or picosecond range.

A laser beam 7 such as this is used to illuminate a measurement object or an object 8 to be recorded. The light reflected back—reflected radiation 9—passes through an optical filter arrangement 11 which distributes the radiation 9 between individual measurement channels—color channels 12—in such a way that radiation at a single wavelength is in each case recorded by an associated camera 13. This means that a specific recording can in each case be associated with one image in one measurement branch or measurement channel, with this image having been recorded with a specific illumination intensity. The pulse intervals are in this case sufficiently small so that the individual recordings are obtained effectively from a stationary object. A DRI or HDR image can then be produced by means of suitable image processing methods from the individual recordings obtained in this way.

In a second version of the apparatus 20, a plurality of wavelengths which have different intensities are produced by the use of different short-pulse laser techniques in a single laser pulse.

The apparatus 20 accordingly has the transmitting part 22 with the laser apparatus 26, and an illuminating laser. The receiving part 24 has the recording device 28—in this case with the optical filter arrangement 11 and the individual cameras 13—and the image processing unit 14.

In the first embodiment, illustrated in FIGS. 1 to 3, the radiation from the short-pulse laser 1, which emits laser pulses with pulse widths in the nanosecond or picosecond range, is split into a plurality of branches by means of beam splitters 2 of different reflection and transmission for the pump radiation.

In the exemplary embodiment shown in FIG. 1, this is illustrated by way of example for six beam elements 4, which six beam elements 4 each have different intensities. Each individual beam element 4 has its wavelength transformed by means of optically non-linear materials 3, with different wavelengths being produced. This is achieved by using optically non-linear processes. By way of example, higher harmonics can be produced, conversion can be carried out by means of optically parametric oscillators or generators, and stimulated Raman scattering or four-wave mixing processes can be used in order to convert the primary radiation to different wavelengths.

The beam elements 4 of different color obtained in this way are combined to form a single laser beam 7, and this is done, for example, using a simple arrangement of edge filters 5.

The intensities at the different wavelengths can also be set in a simple manner by means of a suitable color filter (not illustrated) which is inserted into the laser beam 7.

In order to determine the different illumination intensities required for image processing at the individual wavelengths, a fraction of the laser beam is passed to a measurement unit 18 by means of a beam splitter 17.

The laser beam 7 now contains a pulse sequence 16 which is composed of individual pulses 15a to 15f which are at different wavelengths $\lambda_N$ and have different intensities $I_N$, as is illustrated in FIG. 2.

The divergence of the resultant laser beam 7 can be adapted by means of a suitable first telescope 6 such that the object 8 is optimally illuminated. The pulse sequences can be repeated, corresponding to the repetition rate of the short-pulse laser 1.

As is illustrated in FIG. 3, the radiation 9 reflected back from the object 8 is detected by a second telescope 10, and is then passed by means of a filter arrangement 11 into individual color channels 12, which each contain a camera 13 by means of which the color-coded images are recorded.

The image processing unit 14 can now produce a DRI image or HDR image from the images from the individual measurement channels or color channels 12, which have been recorded with different illumination intensities.

Since the laser radiation can be produced with high intensities, with a large number of photons being produced, even poorly reflective objects and/or objects a long distance away can also be detected.

Figure 4:
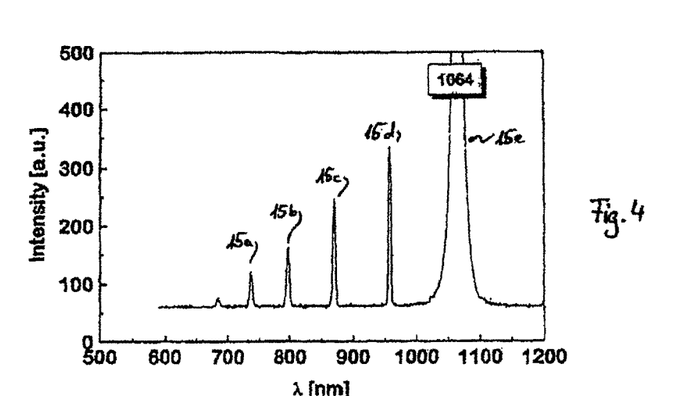
FIGS. 4 and 5 show two graphs, which show examples of wavelength spectra which are sent at the same time in a single laser pulse, with different intensities and at different wavelengths.

In a second refinement of the apparatus 20, which is not illustrated in more detail but whose basic design is very similar, the laser apparatus 26, which is used as a transmitting or illuminating laser, produces a plurality of wavelengths in a single pulse, with the intensities of these wavelengths being different. For example, the laser apparatus 26 has a multicolor laser for this purpose. In an arrangement such as this with a multicolor laser, there is no need to split the primary laser beam into a plurality of branches as in the case of FIG. 1. By way of example, a multicolor laser such as this uses the optically non-linear process of stimulated Raman scatter, in which a plurality of discrete wavelengths are produced from one laser pulse at a specific wavelength, which discrete wavelengths have different intensities depending on their order in accordance with the so-called Stokes or anti-Stokes lines; in this context, see in detail J. Findeisen, H. J. Eichler, P. Peuser, A. A. Kaminskii, J. Hulliger; Appl. Phys. B 70 (2000) 159. By way of example, a laser pulse produced in this way is illustrated as a spectrum diagram in FIG. 4.

Figure 5:
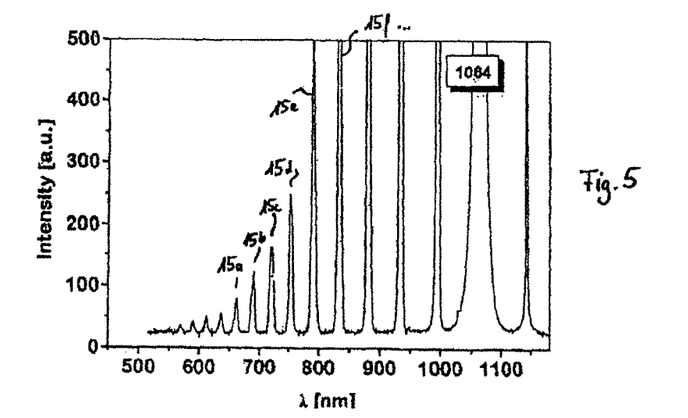

FIG. 5 illustrates another example, in which a wavelength sequence with different intensities has been produced by four wavelength mixtures; for more details relating to this, see J. Findeisen, Dissertation, TU Berlin, 1999, D83, Chapter 3, pages 39-40.

The production of earlier harmonics and/or conversion by means of optically parametric oscillators or generators can also be used as other non-linear processes in order to convert the primary radiation to different wavelengths.

Furthermore, the production of so-called "chirped pulses" can also be used to produce an individual laser pulse which contains different wavelengths with different intensities, with the frequencies or wavelengths contained in an ultra-short pulse producing a continuous color spectrum whose intensity profile can be influenced as a function of the wavelength in a simple manner, for example also by subsequent color filtering, thus resulting in significant intensity differences in the wavelength spectrum. By way of example, chirped pulses can be produced in a simple manner by passing an ultra-short pulse through a transparent medium.

Arrangements of semiconductor lasers with high power levels are also suitable as further laser illumination beam sources which produce different intensities at different wavelengths for DRI or HDRI pictures in a single illumination pulse, as will be explained in more detail in the following text with reference to FIGS. 6 to 8.

Figure 6:
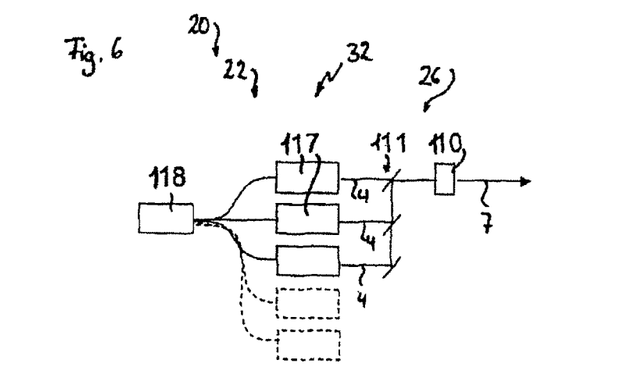
FIG. 6 shows a schematic illustration of a transmitting part for a second embodiment of the apparatus for DRI or HDR image production.
Figure 7:
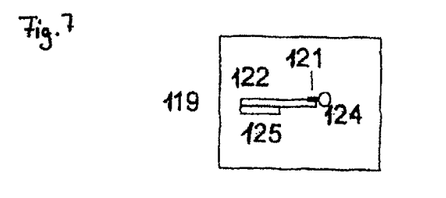
FIG. 7 shows a schematic illustration of an individual diode laser unit.

FIG. 6 shows a further embodiment of the laser apparatus 26, which can be used in a transmitting part 22 of a further embodiment of the apparatus 20. The laser apparatus 26 has an arrangement 32 comprising a plurality of lasers, in this case in the form of high-power diode lasers 117. In a first refinement of this arrangement 32, diode lasers 117 with different emission wavelengths are provided. By way of example, diode lasers are provided that emit at 780 nm, 800 nm, 820 nm, 840 nm, etc. The radiation elements at different emission wavelengths are in each case emitted with different power levels. The beam elements 4 from the individual diode lasers 117 are superimposed colinearly, and are combined to form a single laser beam 7. By way of example, this is done using edge filters 111. A suitable high beam quality is advantageous for this purpose. This can be achieved for each individual diode laser 117 using, for example, the same beam-forming techniques as those used for efficient injection of diode laser radiation at a high power level into an optical fiber. For example, it is thus possible to inject diode laser radiation at more than 1 kW into an optical fiber. For further details relating to the applicable techniques, reference is made to P. Peuser et al., Opt. Lett. 31 (2006) 1991.

In the embodiment shown in FIG. 6, the individual diode lasers 117 are synchronized with the aid of a common control unit 118, such that the emission takes place at the same time. The pulse lengths are typically in the range between 110 µs and one millisecond. Longer pulse lengths are possible. The available pulse energies may in this case be in the range up to one Joule or more, as a result of which a large number of photons are produced.

However, it is also possible to use other diode laser types, which produce pulse widths in the region of several 10 ns or 100 ns. In this case, the achievable number of photons is, however, a number of orders of magnitude less. Further available wavelength ranges are around 900 nm to 980 nm, or else around 1500 nm. This wavelength range is particularly advantageous for eye-safe operation.

A novel compact variant of an arrangement 32 of high-power diode lasers 117 such as this will be explained in more detail in the following text with reference to FIGS. 7 and 8, and this arrangement 32 is particularly suitable for use as an illumination source in the methods and apparatuses proposed here.

In order to produce high output power levels up to the kW range, a plurality of so-called diode laser bars 119 are stacked one on top of the other, according to the prior art. This is explained in more detail, for example, in P. Peuser, N. P. Schmitt; Diodengepumpte Festkörperlaser; Springer-Verlag, Heidelberg, 1995, to which express reference is made. As shown in FIGS. 7 and 8, a plurality of diode laser bars 119 are now combined in a common stack 120 for use as a DIR or HDR illumination beam source, with different emission wavelengths. The bars typically have a width of about 10 mm, with the diode laser elements 21 ("arrays") being formed on a mount 122, via which the heat losses are passed to a common heat dissipation plate 123.

Micro-cylindrical lenses 124 are additionally fitted for better beamforming, as is known in principle in the prior art. The individual diode laser bars 119 are separated from one another by spacing elements 125. The radiation emitted from the individual diode laser bars 119 is then combined using suitable beamforming techniques—in this context see P. Peuser et al., Opl. Lett. 31 (2006) 1991—to form a single laser beam 7.

The diode laser power levels available at each individual wavelength can be determined by a different number of diode laser bars 119 for each individual wavelength range.

However, alternatively or additionally, individual diode laser bars 119 or emission groups of diode lasers 117/119 which are characterized by their wavelength can also be operated separately by means of appropriate power supply lines 126, thus allowing the emission power for each individual wavelength to be determined by regulation of the diode current.

Exemplary embodiments for the apparatus 20 for DRI or HDR image production have been described above, in which the different intensities in each case emitted by the laser apparatus 26 differ by means of color coding. However, there have recently been ever greater developments in the field of high-speed cameras. If required, correspondingly fast cameras 13 make it possible to dispense with color or wavelength coding for the illuminating radiation. This is particularly the case if the camera 13 can differentiate sufficiently quickly between such images and can record images which have been illuminated with laser radiation which consists of a sequence of quickly successive pulses at different power levels.

Figure 9:
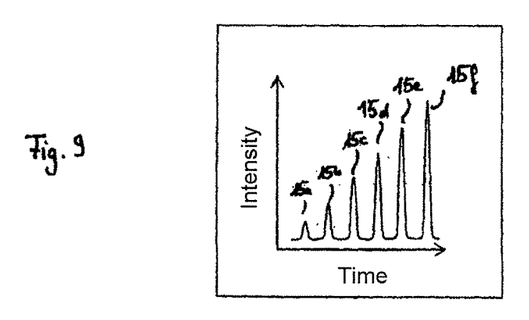
FIG. 9 shows a graph which shows a pulse sequence of laser pulses with a different amplitude as an example of further laser radiation, which is used for exposure purposes for DRI pictures or HDR pictures.

Suitable pulses can be produced by using appropriate laser techniques according to the prior art, with time intervals in the range from 10 µs up to several milliseconds. FIG. 9 illustrates one example of a pulse sequence.

Figure 10:
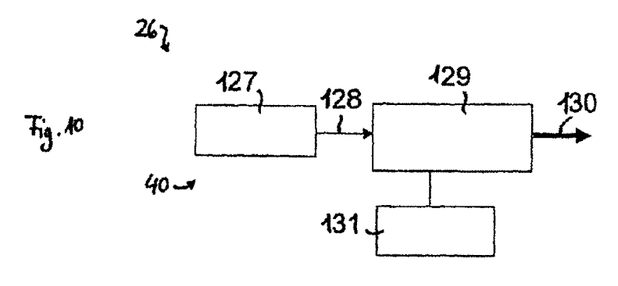
FIG. 10 shows a schematic illustration of a laser oscillator/laser amplifier apparatus, which can be used as a transmitting part in a further embodiment of the apparatus for HDR or DRI image production.

FIG. 10 illustrates one example of a laser apparatus 26 such as this, which can produce the suitable pulses. This exemplary embodiment for the laser apparatus 26 is in the form of a laser oscillator/laser amplifier apparatus 40. This laser oscillator/laser amplifier apparatus 40 has a laser oscillator 127 and a laser amplifier 129, as well as a power supply and pulse-shaping unit 131.

The laser oscillator 127 produces a laser beam 128, which produces a sequence of a plurality of pulses of the same amplitude, for example with pulse widths in the range from 1 ns to 500 ns.

The energy in the individual pulses is increased in the laser amplifier 129 which is arranged downstream from this.

Figure 11:
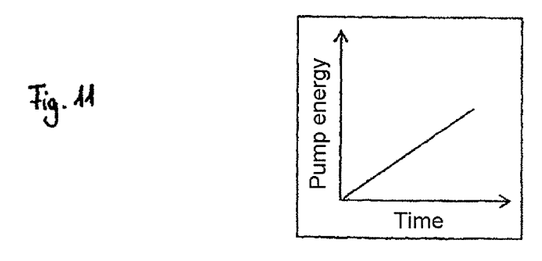
FIG. 11 shows a graph to illustrate pump energy which varies over time and is applied to the laser amplifier in the laser oscillator/laser amplifier apparatus shown in FIG. 10.

In order to achieve the variation of the pulse amplitudes in the amplified illumination beam 130 as is required for DRI or HDR pictures, the pump energy of the laser amplifier, which is provided by the power supply and pulse-shaping unit 131, is varied for the duration of the oscillator pulse sequence such that the pulses which pass through the laser amplifier 129 successively, that is to say at different times, are amplified to different extents. One example of a profile of the pump energy of the laser amplifier 129, which may be used in this case, is illustrated as a function of time in FIG. 11.

Furthermore, a suitable pulse sequence with a power level which varies over time can also be produced by the arrangements 32, as described above, of a plurality of lasers, in particular by the high-power diode laser configurations described above.

There is no need for different emission wavelengths in this case, as well. The individual diode lasers 117 or diode laser bars 119 can (but need not) emit in the same wavelength range. A corresponding illumination profile over time can be produced by pump-current pulses which are applied successively to the individual diode lasers 117, 119 and have a different current level. Such current pulses have a typical length of about 100 µs up to 1 ms, as a result of which the overall pulse sequence can have a length of several milliseconds, which is nevertheless sufficient for exposure purposes.

Figure 8:
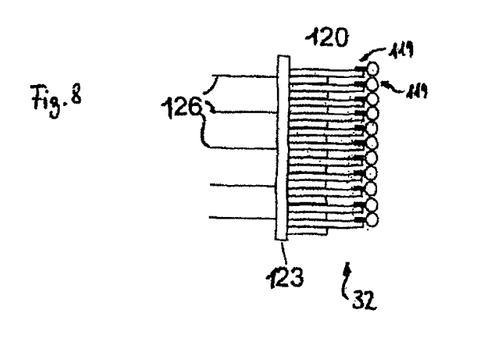
FIG. 8 shows a schematic illustration of a further exemplary embodiment of a transmitting part for an apparatus for DRI or HDR image production, which is composed of a plurality of diode laser units as shown in FIG. 7.

This also applies to the same extent to the compact variant which is in the form of a stack 120 as shown in FIG. 8. In this case, the individual diode laser bars 119 are then operated separately, thus resulting in correspondingly different emission power levels as a result of different current levels which are applied successively for excitation of the diode laser bars 119.

In this case, it is advantageous for the individual beam elements 4 preferably to be injected into a quartz multimode fiber with an optical configuration as described in P. Peuser et al., Opt. Lett. 31 (2006) 1991. When the optical pulses pass through the fiber, which typically has a length of several meters, the intensity distribution is homogenized over the fiber cross section. The radiation is then used to illuminate the scene to be recorded, by means of a suitable optical arrangement, for example a telescope—first telescope 6.

The receiving part (not illustrated) of an apparatus 20 such as this, in which the individual intensities are identified purely by the time sequence, will be distinguished by an appropriately designed high-power camera which then in each case successively records the individual images which are exposed with only one of the successive pulses.

What is claimed is:

1. A method for producing dynamic range increase (DRI) or high dynamic range (HDR) pictures, the method comprising:
   irradiating an object with laser radiation including radiation elements having different wavelengths that are each emitted with specific different intensities at the same time to produce differently exposed individual images;
   capturing radiation reflected from the object which has been exposed to the laser radiation on the basis of wavelengths to produce the differently exposed individual images with different illumination intensities; and
   combining the differently exposed individual images to form a DRI or HDR picture.

2. The method as claimed in claim 1, wherein
the laser radiation having different wavelengths is emitted in one laser illumination pulse.

3. The method as claimed in claim 1, wherein
the irradiating includes combining radiation emitted by a plurality of lasers to create the laser radiation irradiated on the object.

4. The method as claimed in claim 1, wherein
the irradiating includes combining radiation emitted by a plurality of lasers to create the laser radiation irradiated on the object.

5. The method as claimed in claim 4, wherein the irradiating includes
   operating the plurality of lasers to emit beam elements of the different intensities and at least one of the following
      the different wavelengths corresponding to the different intensities; and
      a predetermined time sequence of laser pulses of the different intensities; and
   combining the beam elements to form the laser radiation.

6. The method as claimed in claim 5, wherein
the operating the plurality of lasers includes operating the plurality of lasers to emit the beam elements synchronously.

7. The method as claimed in claim 1, further comprising measuring the different intensities of the laser radiation; and associating the individual images with different intensities used for exposure.

8. An apparatus for producing dynamic range increase (DRI) or high dynamic range (HDR) pictures, the apparatus comprising:
   an emitting device configured to emit light radiation including light radiation elements of different intensities at the same time to an object, the emitting device being further configured to provide a respective identification for each of the light radiation elements having the different intensities and to transmit each of the light radiation elements at a different wavelength to provide the respective identification for each of the light radiation elements, such that a wavelength is associated with an intensity;
   a recording device configured to capture radiation reflected by the object to capture differently exposed individual images of the object, the recording device including a filter configured to filter the radiation reflected by the object based on the respective identifications to record individual images based on the light radiation elements having the different intensities, and the filter being configured to filter the light radiation of the different wavelengths to produce the exposed individual images; and
   an image processing unit configured to produce a DRI or HDR picture from a plurality of the exposed individual images which have been captured by the recording device.

9. The apparatus as claimed in claim 8, wherein
the emitting device includes a plurality of lasers configured to produce laser radiation elements at the different intensities as the light radiation elements.

10. The apparatus as claimed in claim 9, wherein
the plurality of lasers are configured to emit the laser radiation elements at the different wavelengths.

11. The apparatus as claimed in claim 8, wherein
the emitting device includes a plurality of diode lasers which are configured to produce laser radiation having the different intensities as the light radiation, and wherein the diode lasers have at least one of the following characteristics
different emission wavelengths; and
are operated successively for emission in a specific time sequence.

12. The apparatus as claimed in claim 11, wherein
the diode lasers are configured to emit a different number of diode laser elements for each emission wavelength, with the different intensities at the different emission wavelengths.

13. The apparatus as claimed in claim 11, further comprising
   a control unit configured to operate the individual diode lasers or emission groups of the diode lasers with different intensity, to produce the different intensities of the radiation element emitted at the individual wavelengths.

* * * * *